(12) United States Patent
Yamakawa

(10) Patent No.: US 9,236,508 B2
(45) Date of Patent: Jan. 12, 2016

(54) SOLID-STATE IMAGE PICKUP ELEMENT AND IMAGE PICKUP APPARATUS

(71) Applicant: Sony Corporation, Tokyo (JP)

(72) Inventor: Shinya Yamakawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/312,836

(22) Filed: Jun. 24, 2014

(65) Prior Publication Data

US 2014/0299954 A1    Oct. 9, 2014

Related U.S. Application Data

(63) Continuation of application No. 13/053,427, filed on Mar. 22, 2011, now Pat. No. 8,780,247.

(30) Foreign Application Priority Data

Mar. 29, 2010    (JP) ................. 2010-075400

(51) Int. Cl.
*H04N 3/14*    (2006.01)
*H04N 5/335*    (2011.01)
*H01L 31/0232*    (2014.01)
(Continued)

(52) U.S. Cl.
CPC ...... *H01L 31/02327* (2013.01); *H01L 27/1461* (2013.01); *H01L 27/14603* (2013.01); *H01L 27/14641* (2013.01); *H01L 27/14689* (2013.01); *H01L 31/06* (2013.01); *H01L 27/1463* (2013.01)

(58) Field of Classification Search
USPC .................. 348/294, 300; 257/291
See application file for complete search history.

(56) References Cited

U.S. PATENT DOCUMENTS

| 7,091,536 B2 | 8/2006 | Rhodes et al. |
| 7,728,279 B2 | 6/2010 | Mauritzson |

(Continued)

FOREIGN PATENT DOCUMENTS

| JP | 2003-258229 | 9/2003 |
| JP | 2006-032385 | 2/2006 |

(Continued)

OTHER PUBLICATIONS

Chinese Office Examination Report issued in connection with related Chinese Patent Application No. CN 201110068094.2 dated Aug. 26, 2014.

(Continued)

*Primary Examiner* — Christopher K Peterson
(74) *Attorney, Agent, or Firm* — Dentons US LLP

(57) ABSTRACT

Disclosed herein is a solid-state image pickup element, including: a photoelectric conversion region; a transistor; an isolation region of a first conductivity type configured to isolate the photoelectric conversion region and the transistor from each other; a well region of the first conductivity type having the photoelectric conversion region, the transistor, and the isolation region of the first conductivity type formed therein; a contact portion configured to supply an electric potential used to fix the well region to a given electric potential; and an impurity region of the first conductivity type formed so as to extend in a depth direction from a surface of the isolation region of the first conductivity type in the isolation region of the first conductivity type between the contact portion and the photoelectric conversion region, and having a sufficiently higher impurity concentration than that of the isolation region of the first conductivity type.

9 Claims, 14 Drawing Sheets

(51) Int. Cl.
*H01L 27/146* (2006.01)
*H01L 31/06* (2012.01)
*H01L 31/062* (2012.01)
*H01L 31/113* (2006.01)

(56) References Cited

U.S. PATENT DOCUMENTS

2003/0160295 A1* 8/2003 Okita ............................ 257/506
2006/0043393 A1   3/2006 Okita et al.
2007/0069248 A1   3/2007 Ohta
2008/0035963 A1*  2/2008 Kwon et al. ................... 257/291
2009/0067702 A1*  3/2009 Mauritzson ................... 382/145

FOREIGN PATENT DOCUMENTS

| | | |
|---|---|---|
| JP | 2006-073735 | 3/2006 |
| JP | 2006-073736 | 3/2006 |
| JP | 2007-095917 | 4/2007 |
| JP | 4075773 | 4/2008 |
| JP | 2009-026984 | 2/2009 |
| JP | 2011-210837 | 3/2010 |

OTHER PUBLICATIONS

Japanese Office Examination Report issued in connection with related Japanese Patent Application No. 2014-093477 dated Feb. 24, 2015.

* cited by examiner

PRIOR ART    FIG.23
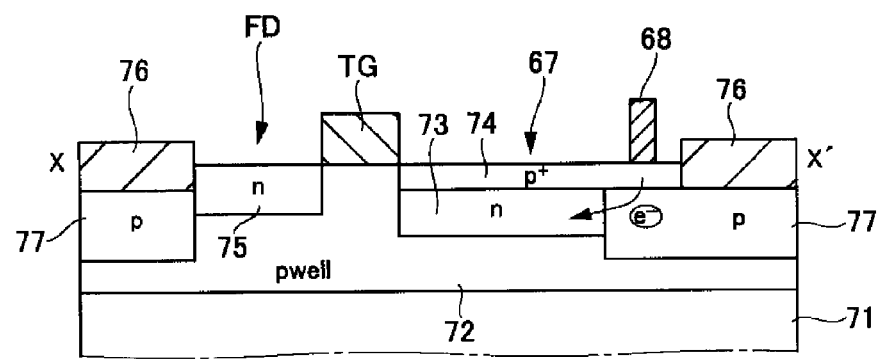
PRIOR ART    FIG.24
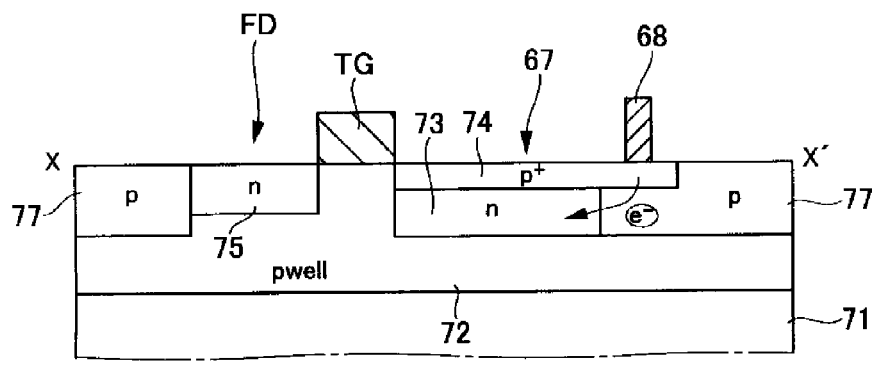

PRIOR ART  FIG.29
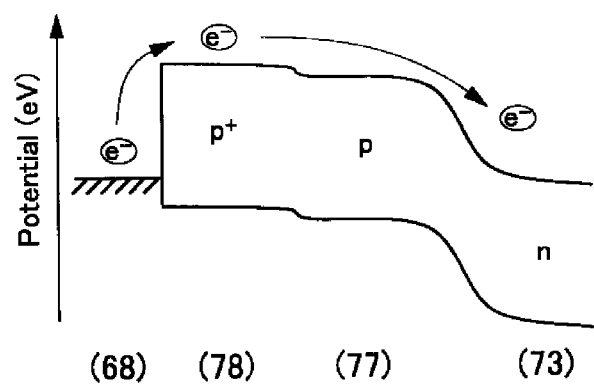

SOLID-STATE IMAGE PICKUP ELEMENT AND IMAGE PICKUP APPARATUS

RELATED APPLICATION DATA

This application is a continuation of U.S. patent application Ser. No. 13/053,427 filed Mar. 22, 2011, the entirety of which is incorporated herein by reference to the extent permitted by law. The present application claims the benefit of priority to Japanese Patent Application No. JP 2010-075400 filed on Mar. 29, 2010 in the Japan Patent Office, the entirety of which is incorporated by reference herein to the extent permitted by law.

BACKGROUND OF THE INVENTION

1. Field of the Invention

The present invention relates to a solid-state image pickup element and an image pickup apparatus, such as a camera, including the same.

2. Description of the Related Art

A configuration including a photodiode utilizing a pn junction of a semiconductor as a photoelectric conversion element is known for a solid-state image pickup element (image sensor) using a semiconductor.

Such a solid-state image pickup element is mounted to many apparatuses such as a digital camera, a video camera, a monitoring camera, a copying machine, and a facsimile.

Also, a so-called CMOS (complementary metal oxide semiconductor) type solid-state image pickup element which is manufactured in a CMOS process, including a peripheral circuit is used as such a solid-state image pickup element in many cases.

FIG. 20 is a schematic block diagram showing an example of a configuration of a CMOS type solid-state image pickup element.

As known in FIG. 20, the CMOS type solid-state image pickup element includes plural pixels 51 which are disposed in a matrix and each of which carries out photoelectric conversion, vertical signal lines 52 through which signals are taken out from the pixels 51, respectively, a vertical selection circuit 53, a horizontal selection/signal processing circuit 54, and an output circuit 55 on the same semiconductor substrate. In FIG. 20, reference numeral 56 designates an image capturing area.

FIG. 21 is a circuit diagram showing a configuration of a unit pixel of the CMOS type solid-state image pickup element shown in FIG. 20.

As shown in FIG. 21, the unit pixel includes a photodiode PD serving as a photoelectric conversion element, a transfer transistor 61, a reset transistor 62, an amplification transistor 63, a selection transistor 64, a vertical signal line 65, and a floating diffusion area $C_{FD}$.

The reset transistor 62, the transfer transistor 61, and the selection transistor 64 are connected to a reset line RST, a transfer line TX, and a horizontal selection line SEL, respectively, and are driven in accordance with pulse signals from the vertical selection circuit 53 shown in FIG. 20.

The photodiode PD is connected in one end thereof to the ground, and converts a light made incident thereto into electrons (or holes) by photoelectric conversion to accumulate therein the resulting electric charges (electrons or holes). The other end of the photodiode PD is connected to the floating diffusion area $C_{FD}$ through the transfer transistor 61. Thus, by turning ON the transfer line TX, the electric charges are transferred from the photodiode PD to the floating diffusion area $C_{FD}$.

One end of the floating diffusion area $C_{FD}$ is connected to a gate electrode of the amplification transistor 63, and is also connected to the vertical signal line 65 through the selection transistor 64. Plural unit pixels are connected to the vertical signal line 65. Thus, the selection transistor 65 connected to a certain specific vertical signal line 65 is turned ON, whereby a signal from a desired photodiode PD is outputted. The vertical signal line 65 is connected to a transistor (constant current source) 66 biased by a constant voltage and composes a so-called source follower circuit in combination with the amplification transistor 63.

In addition, FIG. 22 shows an example of a planar layout of the unit pixel of the CMOS type solid-state image pickup element.

For isolation of the photodiode PD and the transistors, a p-type well region (not shown) is provided in the circumference of the photodiode PD and the transistors.

Although heretofore, a well constant is provided only in the circumference of the pixel area, in this example, the contact is provided in each of the pixels along with the multiple pixel promotion. That is to say, for the purpose of connecting a metallic wire 69 and a p-type well region to each other, a well contact 68 is provided in a top left corner of a photoelectric conversion area 67 including a photodiode.

Here, FIG. 23 is a cross sectional view taken on line X-X' of FIG. 22 in the case where isolation between elements is carried out by an insulator and a p-type region. An upper metallic wiring layer is omitted in illustration in FIG. 23.

Although the isolation between the elements is basically carried out by an insulator 76, normally, a p-type region 77 is formed under the insulator 76. The p-type region 77 is connected together with a $p^+$-type region 74 on the surface of the photodiode to the well contact 68.

Although in FIG. 23, the inter-element isolation is carried out by both the isolation 76 and the p-type region 77, as with a cross sectional view shown in FIG. 24 similar to FIG. 23, the inter-element isolation region can be formed by only the p-type region 77.

In this case as well, similarly to the case of FIG. 23, both the p-type region 77 for the inter-element isolation, and the $p^+$-type region 74 on the photodiode are connected to the well contact 68.

As shown in FIGS. 23 and 24, the p-type region 77 for the inter-element isolation is connected to the well contact 68. In this structure, however, there is known a problem that electrons $e^-$ as minority carriers are injected from the well contact 68 to the p-type region 77. This problem is described in Japanese Patent Laid-Open No. 2006-32385.

That is to say, this problem is such that as indicated by arrows in FIGS. 23 and 24, respectively, the injected electrons $e^-$ are diffused within the p-type region 77 to flow into the n-type region 73 in which the electrons generated in the photodiode by the photoelectric conversion are accumulated, and turn into a dark current, thereby deteriorating the image quality.

Now, as shown in a circuit diagram of FIG. 25, a so-called sharing pixel configuration in which the floating diffusion area $C_{FD}$, the amplification transistor 63, and the selection transistor 64 are shared among plural photodiodes is generally known.

In the circuit configuration shown in FIG. 21, the configuration is adopted such that one photodiode PD is connected to one amplification transistor 63. On the other hand, in the circuit configuration shown in FIG. 25, a configuration is adopted such that four photodiodes PD1, PD2, PD3, and PD4 are connected to one amplification transistor 63. That is to say, the amplification transistor 63 and the like are shared among four pixels. It is noted that the transfer transistor 61 is provided every pixel.

SUMMARY OF THE INVENTION

FIG. 26 shows an example of a planar layout in the case where a configuration is adopted such that an amplification transistor and the like are shared between two pixels.

In an area indicated by a broken line 80 in FIG. 26, the photodiode conversion regions 67 of two pixels are connected commonly to the floating diffusion region FD and the amplification transistor 63.

The problem, shown in FIGS. 23 and 24, that the electrons flow into the photodiode is similarly caused even in a structure as shown in FIG. 26 that the amplification transistor and the like are shared between the two pixels.

Here, FIG. 27 shows a cross sectional view taken on line Y-Y' of FIG. 26 in the case where the pixel isolation region is formed by the insulator and the p-type region. In addition, FIG. 28 shows a cross sectional view taken on line Y-Y' of FIG. 26 in the case where the pixel isolation region is formed by only the p-type region.

Referring to FIGS. 27 and 28, the well contact 68 is formed in a p$^+$-type region 78 which is formed separately from the p$^+$-type region 74 on the surface of the photoelectric conversion region 67. An output contact 70 is connected to an n$^+$-type region 79 of the selection transistor 64 on the left side of each of FIGS. 27 and 28.

In this case as well, the electrons e$^-$ injected from the well contact 68 pass through the p-type region 77 to flow into the n-type region 73 of the photodiode.

FIG. 29 is an energy band diagram showing a situation in which the electron e$^-$ injected from the well contact 68 flows into the photodiode.

Although a portion connected to the well contact 68 is normally formed as the p$^+$-type region 78, a p-type impurity concentration of the p-type region 77 in the circumference of the p$^+$-type region 78 is slightly low. For this reason, the electron e$^-$ injected from the well contact 68, as indicated by an arrow of FIG. 29, flows into the n-type region 73 of the photodiode without encountering a barrier.

The present invention has been made in order to solve the problems described above, and it is therefore desirable to provide a solid-state image pickup element in which flowing of electrons injected from a well contact into a photodiode is suppressed to reduce generation of a dark current, thereby obtaining satisfactory image quality, and an image pickup apparatus including the same.

In order to attain the desire described above, according to an embodiment of the present invention, there is provided a solid-state image pickup element, including:

a photoelectric conversion region provided in each of pixels;

a transistor provided for the photoelectric conversion region of each of the pixels;

an isolation region of a first conductivity type configured to isolate the photoelectric conversion region and the transistor from each other;

a well region of the first conductivity type having the photoelectric conversion region, the transistor, and the isolation region of the first conductivity type formed therein;

a contact portion formed on the isolation region of the first conductivity type configured to supply an electric potential used to fix the well region of the first conductivity type to a given electric potential; and an impurity region of the first conductivity type formed so as to extend in a depth direction from a surface of the isolation region of the first conductivity type in the isolation region of the first conductivity type between the contact portion and the photoelectric conversion region, and having a sufficiently higher impurity concentration than that of the isolation region of the first conductivity type.

According to the solid-state image pickup element of the embodiment of the present invention, the impurity region of the first conductivity type having the sufficiently higher impurity concentration than that of the isolation region of the first conductivity type is formed in the isolation region of the first conductivity type between the contact portion and the photoelectric conversion region.

As a result, the impurity region of the first conductivity type acts as a potential barrier against a minority carrier (electron or hole) injected from the contact portion. Thus, it is possible to suppress or prevent the flowing of the minority carrier into the photoelectric conversion region.

Therefore, it is possible to suppress or prevent the generation of the dark current due to the flowing of the minority carrier into the photoelectric conversion region.

According to another embodiment of the present invention, there is provided a solid-state image pickup element, including:

a photoelectric conversion region provided in each of pixels;

a transistor provided for the photoelectric conversion region of each of the pixels and including at least a transfer transistor and an amplification transistor, the transistor other than the transfer transistor being formed commonly to the photoelectric conversion regions of the plural pixels;

an isolation region of a first conductivity type configured to isolate the photoelectric conversion region and the transistor from each other;

a well region of the first conductivity type having the photoelectric conversion region, the transistor, and the isolation region of the first conductivity type formed therein;

a contact portion formed on the isolation region of the first conductivity type configured to supply an electric potential used to fix the well region of the first conductivity type to a given electric potential; and a barrier formed in the isolation region of the first conductivity type between the contact portion and the photoelectric conversion region, and provided against a minority carrier injected from the contact portion.

According to the solid-state image pickup element of another embodiment of the present invention, the barrier is formed in the isolation region of the first conductivity type between the contact portion and the photoelectric conversion region and is provided against the minority carrier injected from the contact portion.

The provision of the barrier makes it possible to suppress or prevent the flowing of the minority carrier into the photoelectric conversion region.

Therefore, it is possible to suppress or prevent the generation of the dark current due to the flowing of the minority carrier into the photoelectric conversion region.

According to still another embodiment of the present invention, there is provided an image pickup apparatus, including:

a solid-state image pickup element having a photoelectric conversion region provided in each of pixels, a transistor provided for the photoelectric conversion region of each of the pixels, an isolation region of a first conductivity type configured to isolate the photoelectric conversion region and the transistor from each other, a well region of the first conductivity type having the photoelectric conversion region, the transistor, and the isolation region of the first conductivity type formed therein, a contact portion formed on the isolation region of the first conductivity type configured to supply an electric potential used to fix the well region of the first conductivity type to a given electric potential, and an impurity region of the first conductivity type formed so as to extend in a depth direction from a surface of the isolation region of the first conductivity type in the isolation region of the first conductivity type between the contact portion and the photoelectric conversion region, and having a sufficiently higher impurity concentration than that of the isolation region of the first conductivity type;

a light condensing optical portion configured to condense an incident light; and a signal processing portion configured to process a signal obtained in the solid-state image pickup element by photoelectric conversion.

According to yet another embodiment of the present invention, there is provided an image pickup apparatus, including:

a solid-state image pickup element having a photoelectric conversion region provided in each of pixels, a transistor provided for the photoelectric conversion region of each of the pixels and including at least a transfer transistor and an amplification transistor, the transistor other than the transfer transistor being formed commonly to the photoelectric conversion regions of the plural pixels, an isolation region of a first conductivity type configured to isolate the photoelectric conversion region and the transistor from each other, a well region of the first conductivity type having the photoelectric conversion region, the transistor, and the isolation region of the first conductivity type formed therein, a contact portion formed on the isolation region of the first conductivity type configured to supply an electric potential used to fix the well region of the first conductivity type to a given electric potential, and a barrier formed in the isolation region of the first conductivity type between the contact portion and the photoelectric conversion region, and provided against a minority carrier injected from the contact portion;

a light condensing optical portion configured to condense an incident light; and a signal processing portion configured to process a signal obtained in the solid-state image pickup element by photoelectric conversion.

According to the image pickup apparatus of still another embodiment or yet another embodiment of the present invention, the image pickup apparatus includes the solid-state image pickup element of the embodiment or the solid-state image pickup element of another embodiment. Therefore, it is possible to suppress or prevent the generation of the dark current due to the flowing of the minority carrier into the photoelectric conversion region.

As set forth hereinabove, according to the present invention, since it is possible to suppress or prevent the generation of the dark current due to the flowing of the minority carrier into the photoelectric conversion region, it is possible to realize a solid-state image pickup element for obtaining satisfactory image quality, and a high definition image pickup apparatus including the same.

BRIEF DESCRIPTION OF THE DRAWINGS

FIG. 23 is a cross sectional view taken on line X-X' of FIG. 22 in the case where inter-element isolation is carried out by both an insulator and a p-type region;

FIG. 24 is a cross sectional view taken on line X-X' of FIG. 22 in the case where the inter-element isolation is carried out by only the p-type region;

FIG. 29 is an energy band diagram showing a situation in which an electron injected from a well contact flows into a photodiode.

DETAILED DESCRIPTION OF THE PREFERRED EMBODIMENTS

Figure 1:
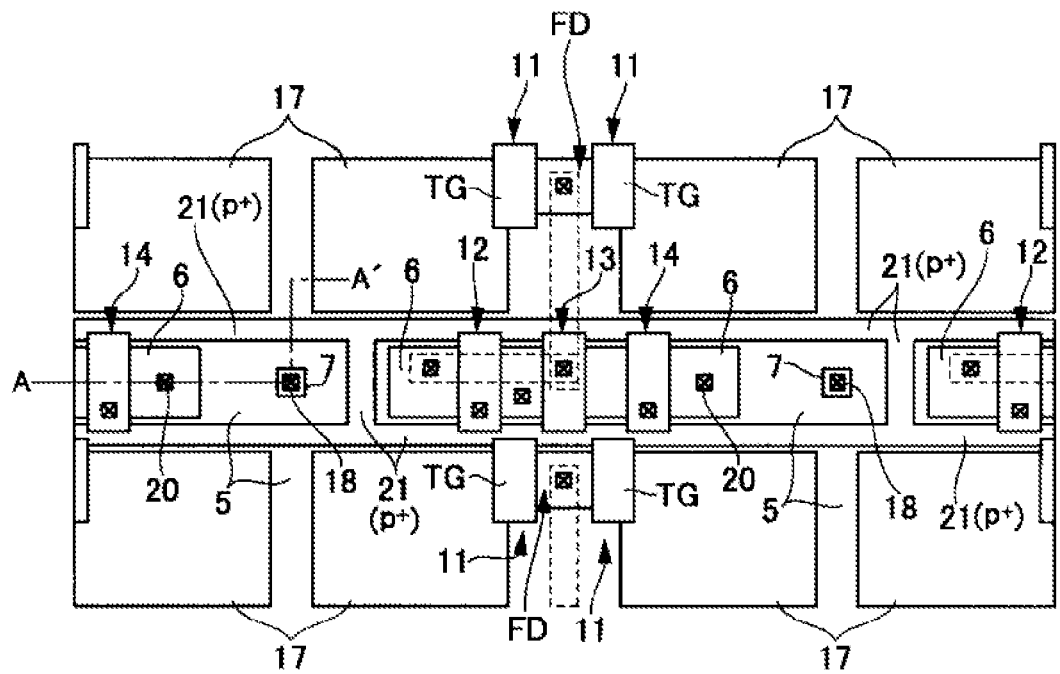
FIG. 1 is a top plan view showing a schematic structure of a main portion of a solid-state image pickup element according to a first embodiment of the present invention.

The preferred embodiments of the present invention will be described in detail hereinafter with reference to the accompanying drawings.

It is noted that the description will be given below in accordance with the following order.
1. Outline of the Present Invention
2. First Embodiment
3. Second Embodiment
4. Third Embodiment
5. Fourth Embodiment
6. Fifth Embodiment
7. Sixth Embodiment
8. Seventh Embodiment

1. Outline of the Present Invention

An outline of the present invention will now be described prior to a description of concrete embodiments.

A solid-state image pickup element of the present invention has the following structure.

The solid-state image pickup element includes a photoelectric conversion region provided in each of pixels, a transistor provided for a photoelectric conversion region of each of the pixels, and an isolation region of a first conductivity type for isolating the photoelectric conversion region and the transistor from each other.

In addition, the solid-state image pickup element includes a well region of the first conductivity type having the photoelectric conversion region, the transistor and the isolation region of the first conductivity type formed therein, and also includes a contact portion formed on the isolation region of the first conductivity type for supplying an electric potential used to fix the well region of the first conductivity type to a given electric potential.

In addition, the solid-state image pickup element includes an impurity region of the first conductivity type formed so as to extend in a depth direction from a surface of the isolation region of the first conductivity type in the isolation region of the first conductivity type between the contact portion and the photoelectric conversion region, and having a sufficiently higher impurity concentration than that of the isolation region of the first conductivity type.

Another solid-state image pickup element of the present invention has the following structure.

Another solid-state image pickup element includes a photoelectric conversion region provided in each of pixels.

In addition, another solid-state image pickup element includes a transistor provided for the photoelectric conversion region of each of the pixels, and including at least a transfer transistor and an amplification transistor. In this case, the transistor other than the transfer transistor is formed commonly to the photoelectric conversion regions of the plural pixels.

In addition, another solid-state image pickup element includes an isolation region of a first conductivity type for isolating the photoelectric conversion region and the transistor from each other, and also includes a well region of the first conductivity type having the photoelectric conversion region, the transistor, and the isolation region of the first conductivity type formed therein.

Moreover, another solid-state image pickup element includes a contact portion formed on the isolation region of the first conductivity type for supplying an electric potential to fix the well region of the first conductivity type to a given electric potential.

Furthermore, another solid-state image pickup element includes a barrier formed in the isolation region of the first conductivity type between the contact portion and the photoelectric conversion region, and provided against a minority carrier injected from a contact.

Since the solid-state image pickup element of the present invention has the structure as described above, the impurity region of the first conductivity type acts as the barrier against the minority carrier (electron or hole) injected from the contact portion. Also, since another solid-state image pickup element of the present invention has the structure as described above, the barrier is formed against the minority carrier (electron or hole) injected from the contact portion.

For this reason, it is possible to suppress or prevent the minority carrier from flowing into the photoelectric conversion region.

Therefore, it is possible to suppress or prevent the generation of the dark current due to the flowing of the minority carrier into the photoelectric conversion region.

In addition, an image pickup apparatus of the present invention includes the solid-state image pickup element of the present invention described above; a light condensing optical portion for condensing an incident light; and a signal processing portion for processing a signal obtained in the solid-state image pickup element described above by photoelectric conversion.

In addition, another image pickup apparatus of the present invention includes another solid-state image pickup element of the present invention described above; a light condensing optical portion for condensing an incident light; and a signal processing portion for processing a signal obtained in another solid-state image pickup element described above by photoelectric conversion.

As a result, since it is possible to suppress or prevent the generation of the dark current due to the flowing of the minority carrier into the photoelectric conversion region, it is possible to realize the high definition image pickup apparatus.

The principles of the present invention will now be described by using simulation results.

Figure 18A:
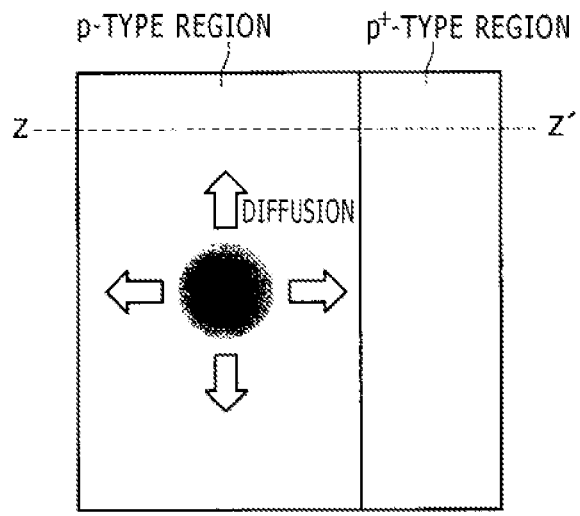
FIGS. 18A and 18B are a view showing a structure obtained by carrying out a simulation, and a potential diagram taken on line Z-Z' of FIG. 18A, respectively.

FIG. 18A is a view showing a structure obtained by carrying out the simulation.

As shown in FIG. 18A, a structure is adopted such that a left side p-type region and a right side $p^+$-type region having a high impurity concentration are joined to each other.

Firstly, electrons are disposed in the p-type region and are diffused thereto as a minority carrier. At this time, it is assumed that a relaxation time is sufficiently long.

Figure 18B:
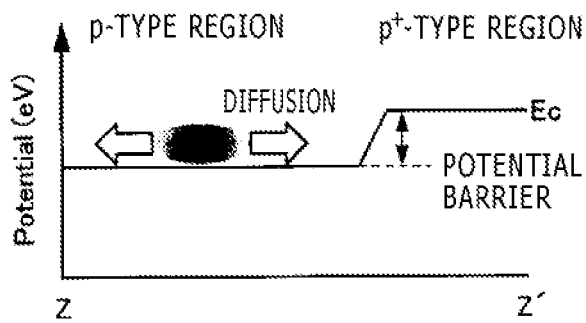

FIG. 18B is a potential diagram taken on line Z-Z' of FIG. 18A.

As shown in FIG. 18B, a potential barrier against the electron is formed between the p-type region and the $p^+$-type region on the right side of the p-type region. Also, the simulations are carried out while the potential of the potential barrier is changed from 0 meV to 75 meV. Thus, the effect of the potential barrier is confirmed based on how many electrons enter into the p$^+$-type region.

Figure 19:
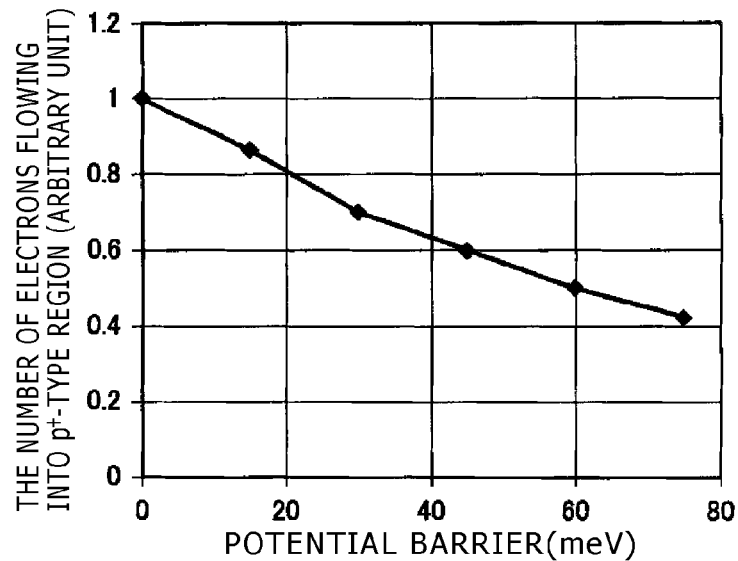
FIG. 19 is a graph representing a relationship between a potential of a potential barrier, and a relative value of the number of electrons which flow into a $p^+$-type region.

FIG. 19 shows a relationship between the potential of the potential barrier and a relative value of the number of electrons which flow into the p$^+$-type region as the simulation results.

As can be seen from FIG. 19, when an amount of electrons which flow into the p$^+$-type region in the case where there is no potential barrier (the potential=0 meV) is set as 1, in the case of 30 meV, the flowing of the electrons into the p$^+$-type region is reduced to about 0.7 times, and in the case of 60 meV, the flowing of the electrons into the p$^+$-type region is reduced to about 0.5 times.

When a difference in concentration between the p$^+$-type region and the p-type region corresponding to the potential barrier is taken into consideration, a relationship between a difference between a difference between an intrinsic level of Si and a quasi-Fermi level of a p-type, and the impurity concentration is expressed by Expression (1):

$$E_i - E_{fp} = k_B T \ln(N_A/n_i) \quad (1)$$

where $E_i$ is an intrinsic level of Si, $E_{fp}$ is a quasi-Fermi level of p-type Si, $k_B$ is a Boltzmann constant, T is a temperature (K), $N_A$ is an impurity density, and $n_i$ is an intrinsic density of Si.

From the calculation based on Expression (1), it is understood that at T=300K, when the concentration of the impurity is changed up to five times, the potential barrier of about 42 meV is formed, and when the concentration of the impurity is increased by one digit, the potential barrier of about 60 meV is formed.

From a combination of this result with the results shown in FIG. 19, it is understood that the impurity concentration of the p$^+$-type region is increased by one digit, whereby an amount of electrons flowing into the p$^+$-type region can be reduced to about a half.

The simulation described above is carried out with respect to the structure that the impurity region of the first conductivity type is formed as the potential barrier.

Even with the structure that a region having a lower potential than that of the isolation region of the first conductivity type is formed as the potential barrier, likewise, an amount of electrons flowing into the p$^+$-type region can be reduced so as to correspond to the potential of the potential barrier.

2. First Embodiment

Subsequently, concrete embodiments of the present invention will be described below.

FIG. 1 is a top plan view showing a schematic structure of a main portion of a solid-state image pickup element according to a first embodiment of the present invention. Also, FIG. 1 shows a top plan view of a part (two pixel length×four pixels width) of an image pickup area of the solid-state image pickup element.

Figure 20:
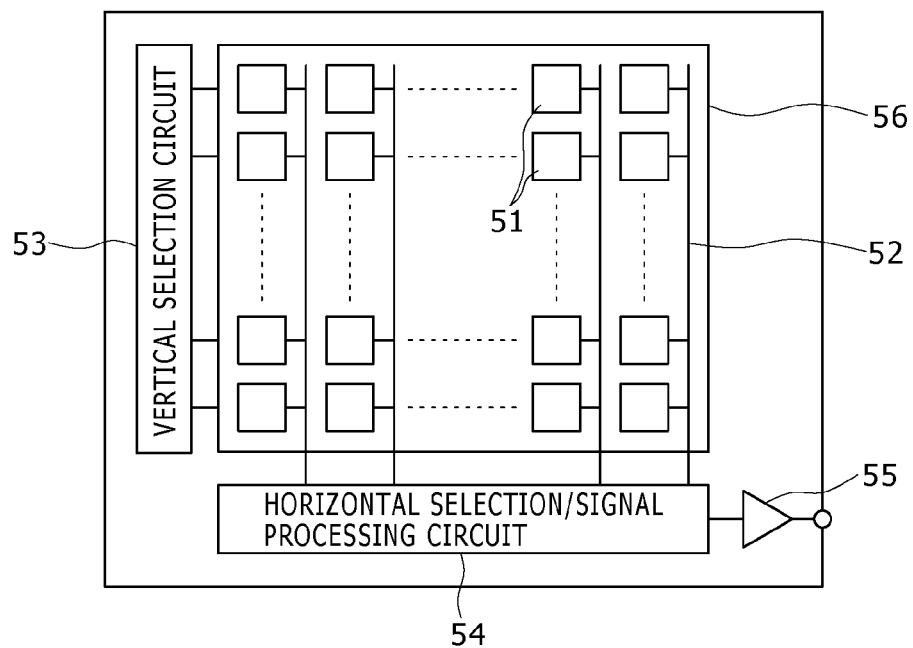
FIG. 20 is a block diagram showing a schematic configuration of an example of a CMOS type solid-state image pickup element.
Figure 21:
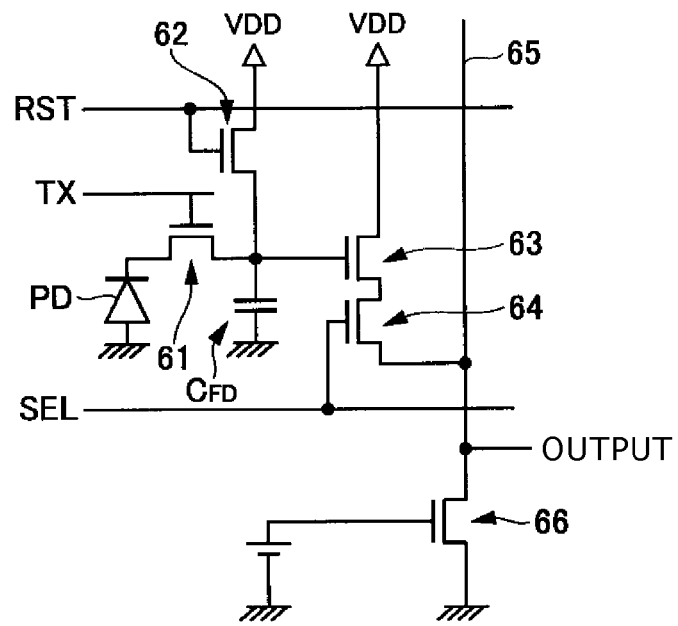
FIG. 21 is a circuit diagram showing a circuit configuration of a unit pixel of the CMOS type solid-state image pickup element shown in FIG. 20.

It is noted that the entire configuration of the solid-state image pickup element can be made identical to that shown in FIG. 20.

As shown in FIG. 1, a photoelectric conversion region 17 including a photodiode is formed in each of pixels. Three transistors of a reset transistor 12, an amplification transistor 13, and a selection transistor 14 are formed continuously as a set between the photoelectric conversion regions 17 of the pixels in an upper row, and the photoelectric conversion regions 17 of the pixels in a lower row.

A well contact 18 is formed in an intermediate position between each adjacent two sets of these transistors 12, 13 and 14.

In addition, a p-type isolation region 5 is formed between each horizontally and vertically adjacent photoelectric conversion regions 17 of the pixels.

The photoelectric conversion region 17 of the pixel is connected to a floating diffusion region FD through a transfer gate TG of the transfer transistor 11. The floating diffusion region FD is connected to a gate of the amplification transistor 13 and an n$^+$-type region 6 of the reset transistor 12 through wirings each indicated by a broken line.

Also, the photoelectric conversion regions 17 of the right and left side two pixels are connected commonly to the floating diffusion region FD, the amplification transistor 13, and the reset transistor 12.

The transfer transistor 11 transfers the electric charges generated in the photoelectric conversion region 17 by the photoelectric conversion to the floating diffusion region FD.

The reset transistor 12 discharges the electric charges accumulated in the floating diffusion region FD to reset the floating diffusion region FD.

The amplification transistor 13 is connected in gate thereof to the floating diffusion region FD, and amplifies a signal voltage so as to correspond to an amount of electric charges in the floating diffusion region FD.

When the selection transistor 14 is turned ON based on the supply of a voltage from a selection line SEL, the selection transistor 14 sends the signal voltage amplified by the amplification transistor 13 to a vertical signal line 15.

Figure 2:
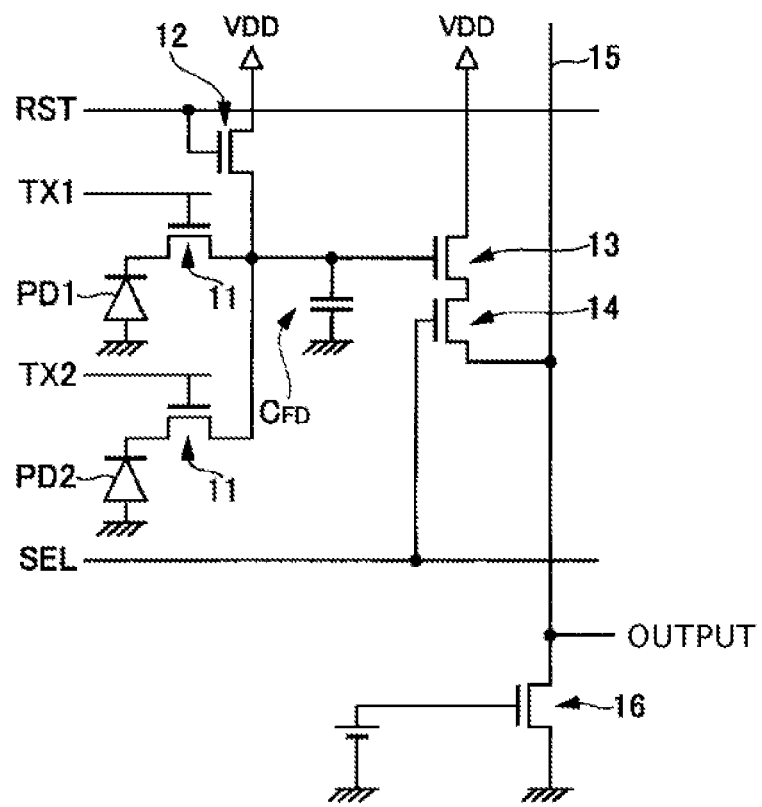
FIG. 2 is a circuit diagram showing a circuit configuration of a pixel of the solid-state image pickup element shown in FIG. 1.

In addition, FIG. 2 is a circuit diagram showing a circuit configuration of the pixel of the solid-state image pickup element shown in FIG. 1.

As shown in FIG. 2, the pixel includes photodiodes PD1 and PD2 each serving as the photoelectric conversion element, the transfer transistor 11, the reset transistor 12, the amplification transistor 13, the selection transistor 14, the vertical signal line 15, and a floating diffusion region $C_{FD}$.

The reset transistor 12, the transfer transistor 11, and the selection transistor 14 are connected to a reset line RST, a transfer line TX, and a horizontal selection line SEL, respectively, and are driven in accordance with pulse signals from a vertical selecting circuit (refer to FIG. 20).

The photodiode PD is connected in one end thereof to the ground, and converts a light made incident thereto into electrons (or holes) by the photoelectric conversion to accumulate therein the resulting electric charges (electrons or holes). The photodiode PD1 and PD2 are connected to the floating diffusion region $C_{FD}$ through the respective transfer transistor 11. Also, by turning ON the transfer lines TX1 and TX2, the electric charges from the photodiodes PD1 and PD2 are transferred to the floating diffusion region $C_{FD}$.

The floating diffusion region $C_{FD}$ is connected in one end thereof to a gate electrode of the amplification transistor 13, and is further connected in one end thereof to the vertical signal line 15 through the selection transistor 14. Plural unit pixels are connected to the vertical signal line 15. Thus, the selection transistor 14 connected to a certain specific vertical signal line 15 is turned ON, thereby outputting a signal from the desired photodiode. The vertical signal line 15 is connected to a transistor (constant current source) 16 biased by a constant voltage, and composes a so-called source follower circuit in combination with the amplification transistor 13.

Also, as shown in FIG. 1, the floating diffusion region FD, the reset transistor 12, the amplification transistor 13, and the selection transistor 14 are shared between two pixels. For this reason, the transfer transistors 11 of the two pixels are connected to the floating diffusion region FD, the reset transistor 12, and the amplification transistor 13 which are common thereto.

With a structure that only the p-type region exists between the well contact and the photoelectric conversion region, the electrons injected from the well contact are diffused into the n-type region to turn into the dark current. This is a problem.

Figure 3:
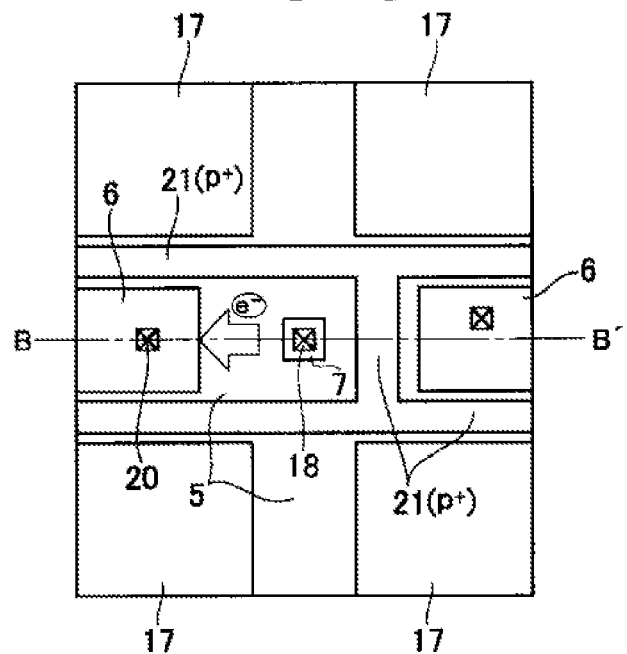
FIG. 3 is an enlarged top plan view showing a structure of the main portion of the solid-state image pickup element shown in FIG. 1.

In order to cope with such a situation, in the first embodiment, as shown in FIG. 1 and FIG. 3 as an enlarged top plan view of FIG. 1, a $p^+$-type region 21 is formed as an electron diffusion preventing region between the well contact 18 and the photoelectric conversion region 17.

Specifically, a stripe-like $p^+$-type region 21 is laterally formed between the photoelectric conversion regions 17 of the pixels of the upper row and the photoelectric conversion regions 17 of the pixels of the lower row, and the well contact 18 and the three transistors 12, 13 and 14. That is to say, the $p^+$-type region 21 is formed so as to have a planar pattern formed as a pattern which surrounds the $n^+$-type region 6 of the three transistors 12, 13 and 14, and the well contact 18.

In addition, the $p^+$-type region 21 is formed so as to have a planar pattern formed as a pattern existing between the $n^+$-type region 6 of the reset transistor 12, and the well contact 18, that is, a longitudinal pattern vertical to the stripe-like pattern.

By forming the $p^+$-type region 21, a barrier is formed between the photoelectric conversion region 17 of the pixel, and the well contact 18, thereby making it possible to suppress the flowing of the electrons into the photoelectric conversion region 17.

It is noted that since the electrons generated from the well contact 18 needs to be discarded, preferably, a structure is adopted such that the barrier is not formed in at least one portion of the circumference of the well contact 18, thereby allowing the electrons to be discarded in the n-type region.

Thus, in the first embodiment, as shown in FIGS. 1 and 3, the $p^+$-type region 21 serving as the barrier is not formed on a side (on a left side in FIG. 1) of the $n^+$-type region 6 of the selection transistor 14, of the circumference of the well contact 18. The $n^+$-type region 6 of the selection transistor 14, as shown in the circuit diagram of FIG. 2, is connected to the vertical signal line 15.

In such a manner, the electrons can be discarded in the $n^+$-type region 6 of the selection transistor 14 connected to the vertical signal line 15.

As described above, in FIGS. 1 and 3, the electrons generated in the well contact 18 are discarded in the $n^+$-type region 6 connected to the vertical signal line 15.

The reason for this is because the $n^+$-type region 6 provided on the reset transistor 12 side of the well contact 18 is connected to the floating diffusion region FD, and thus it is possible that the electrons generated are detected as the dark current.

On the other hand, since the vertical signal line 15 is provided in the subsequent stage of an output buffer, even when a small amount of electrons flows into the $n^+$-type region 6, an influence exerted on the vertical signal line 15 is small.

In the structure of the first embodiment, an impurity concentration of the p-type isolation region is in the range of about $1\times10^{17}$ to about $5\times10^{18}$ cm$^{-3}$, and an impurity concentration of the $p^+$-type region 21 serving as the barrier is in the range of about $1\times10^{18}$ to about $1\times10^{20}$ cm$^{-3}$.

At this time, for the purpose of structuring the sufficient barrier, preferably, the impurity concentration of the $p^+$-type region 21 is about 5 to 100 times as high as that of the p-type isolation region 5.

As described above, the structure is adopted such that the $p^+$-type region 21 has the sufficiently higher impurity concentration than that of the p-type isolation region 5.

In addition, in the first embodiment, the $p^+$-type region 21 serving as the barrier is formed so as to be slightly offset to the inside from a boundary between the photoelectric conversion regions 17 of the pixels. As a result, it is possible to prevent an electric field between the barrier formed by the $p^+$-type region 21 and the photoelectric conversion region 17 from being increased more than necessary. Thus, it is possible to reduce the dark current.

Figure 4:
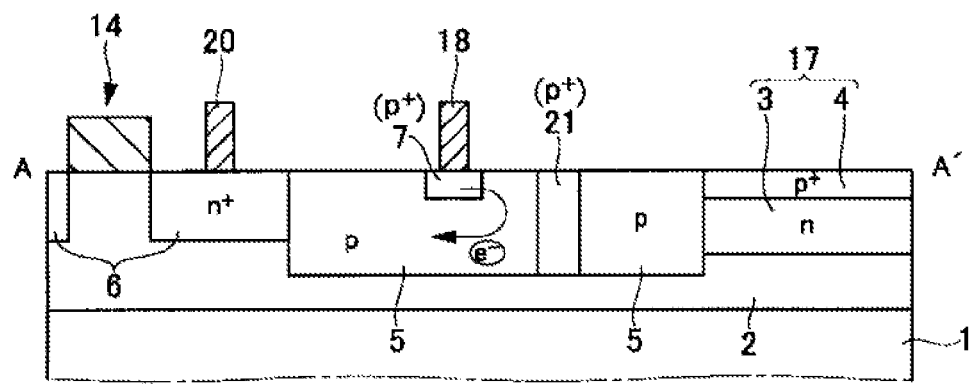
FIG. 4 is a cross sectional view taken on line A-A' of FIG. 1.

In addition, FIG. 4 shows a cross sectional view taken on line A-A' of FIG. 1.

As shown in FIG. 4, the photoelectric conversion region 17, the $n^+$-type region 6 of the transistor, and the p-type isolation region 5 are formed in the p-type well region 2 having a low impurity concentration and formed on the semiconductor substrate 1.

The well contact 18 is formed as a contact portion on the p-type isolation region 5. Also, an electric potential is supplied through the well contact 18, thereby making it possible to fix the p-type well region 2 to a given electric potential. A $p^+$-type region 7 for reducing a contact resistance is formed in a portion under the well contact 18 of the p-type isolation region 5.

Also, the $p^+$-type region 21 serving as the barrier is formed in the p-type isolation region 5 between the $p^+$-type region 7 under the well contact 18, and the photoelectric conversion region 17 composed of an n-type electric charge accumulating region 3 and a $p^+$-type positive electric charge accumulating region 4.

For the purpose of preventing the electrons from flowing into the photoelectric conversion region 17, the $p^+$-type region 21 serving as the barrier extends in a depth direction from the surface of the p-type isolation region 5 to be formed deeply to a certain extent. Although depending on the structures (a size, a layout and the like) of the regions, the $p^+$-type region 21 serving as the barrier can be formed so as to have a depth of about 10 nm to about 1 μm.

In addition, the contact 20 which is connected to the vertical signal line 15 is formed on the $n^+$-type region 6 of the selection transistor 14.

Note that, although in FIG. 4, the $p^+$-type region 21 serving as the barrier is formed to the same depth as that of the p-type isolation region 5, the p-type isolation region 5 and the $p^+$-type region 21 may not have necessarily the same depth. That is to say, one of the p-type isolation region 5 and the $p^+$-type region 21 may be deeper than the other, or may be shallower than the other.

Figure 5:
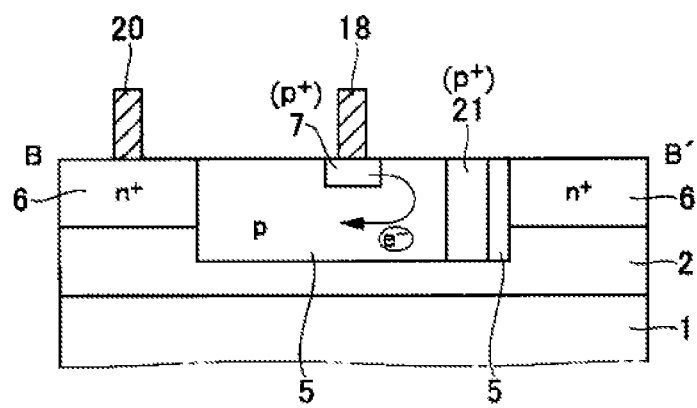
FIG. 5 is a cross sectional view taken on line B-B' of FIG. 3.

In addition, likewise, FIG. 5 shows a cross sectional view taken on line B-B' of FIG. 3.

As shown in FIG. 5, the $p^+$-type region 21 serving as the barrier is formed between the $p^+$-type region 7 under the well contact 18, and the $n^+$-type region 6 of the reset transistor 12 connected to the flowing diffusion region FD. As a result, the electrons $e^-$ generated in the well contact 18 are prevented from flowing into the floating diffusion region FD because the electrons $e^-$ are blocked by the $p^+$-type region 21.

Figure 6:
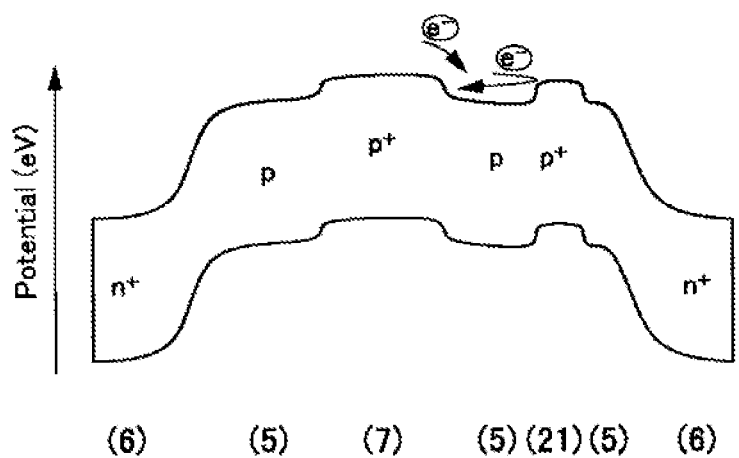
FIG. 6 is an energy band diagram in a cross section shown in FIG. 5.

FIG. 6 shows an energy band diagram in the cross section of FIG. 5.

In the first embodiment, the $p^+$-type region 21 serving as the barrier is formed between the well contact 18 and the photoelectric conversion region 17. Therefore, the electrons $e^-$ as the minority carriers injected from the well contact 18 are hardly injected to the photoelectric conversion region 17 because of the presence of the barrier. Also, the electrons $e^-$ are discharged to the n+-type region 6 provided on the side on which no barrier is formed and connected to the vertical signal line 15.

It is noted that in the first embodiment, the stripe-like p+-type region 21 in the transverse direction of FIG. 1, and the p+-type region 21 in the longitudinal direction of FIG. 1 may be simultaneously formed by using the same mask, or may be formed in order by using different masks, respectively.

In the case of the latter forming method, the impurity concentrations of both the p+-type regions 21 may be identical to each other or may be slightly different from each other.

3. Second Embodiment

Figure 7:
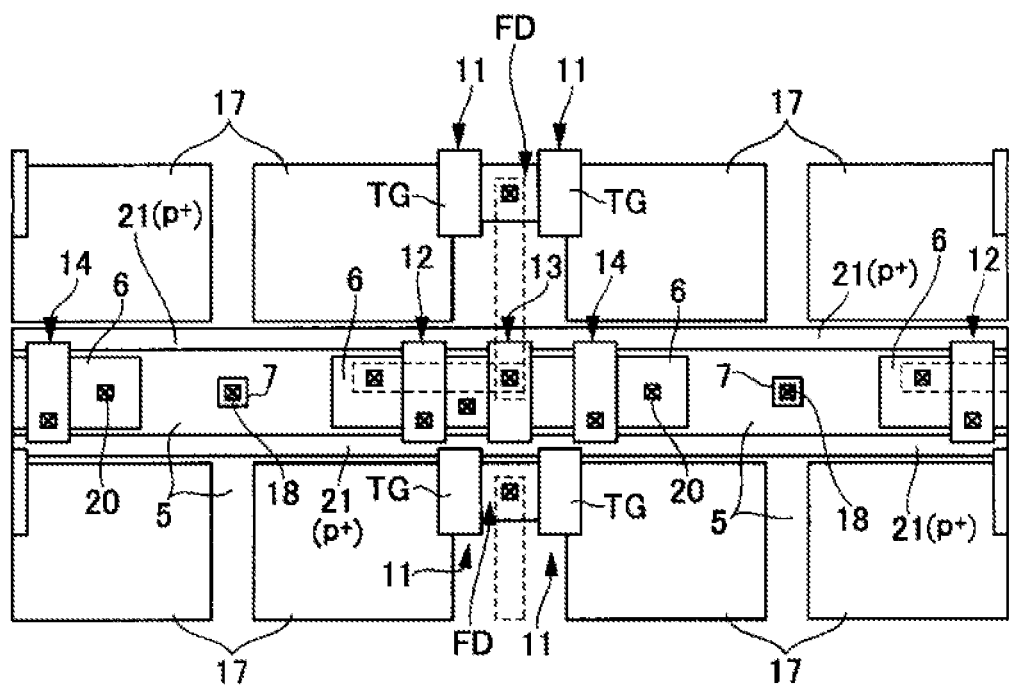
FIG. 7 is a top plan view showing a schematic structure of a main portion of a solid-state image pickup element according to a second embodiment of the present invention.

FIG. 7 is a top plan view showing a schematic structure of a main portion of a solid-state image pickup element according to a second embodiment of the present invention. Also, FIG. 8 is an enlarged top plan view showing a structure of a portion in the vicinity of a well contact shown in FIG. 7.

In the second embodiment, the p+-type region 21 serving as the barrier is formed between the well contact 18 and the photoelectric conversion region 17.

That is to say, the p+-type region 21 is not formed between the n+-type region 6 of the reset transistor 12, and the well contact 18, although the p+-type region 21 is formed there in the first embodiment.

Figure 8:
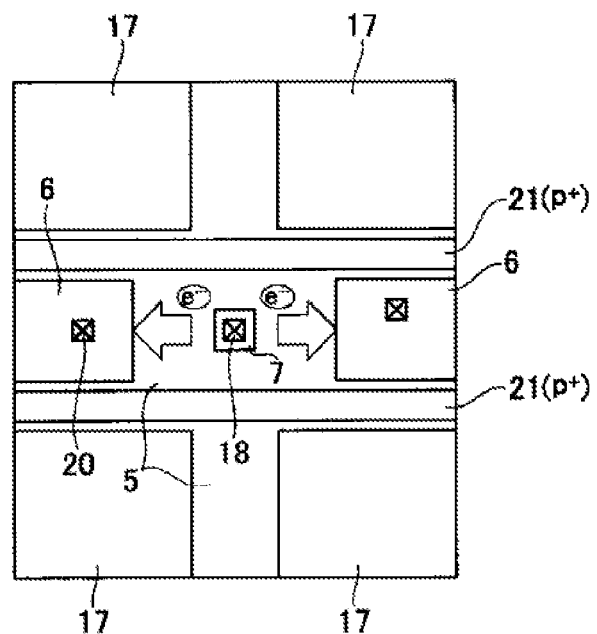
FIG. 8 is an enlarged top plan view showing a structure of a portion in the vicinity of a well contact shown in FIG. 7.

As a result, as indicated by arrows of FIG. 8, the electrons e− generated from the well contact 18 flow into the n+-type regions 6 at the both right and left sides of the well contact 18.

Since other structures in the second embodiment are the same as those in the first embodiment shown in FIGS. 1 to 5, the constituent elements corresponding to those in the first embodiment are designated by the same reference numerals or symbols, respectively, and a repeated description is omitted here.

In the second embodiment, the p+-type region 21 is not formed between the n+-type region 6 of the reset transistor 12, and the well contact 18. To this end, there is the possibility that the electrons e− flow from the n+-type region 6 of the reset transistor 12 into the floating diffusion region FD through the wiring.

However, since the reset operation is carried out before reading operation, the influence of the flowing of the electrons into the floating diffusion region FD is not larger than that in the case of the photoelectric conversion region 17.

In the second embodiment, the planar pattern of the p+-type region 21 serving as the barrier has a simple structure that the planar pattern of the p+-type region 21 is composed of only the stripe pattern in the transverse direction. Therefore, a mask for the impurity implantation can have a simpler structure than that in the case of the structure in the first embodiment.

As a result, it is possible to simplify the manufacturing process and to cause the mask to be easily formed. In particular, when an interval between the pixels becomes short along with the progress of the multiple pixel promotion, a width of the p+-type region 21 serving as the barrier also become narrow and thus it becomes difficult to form a mask having a complicated shape. Therefore, the structure in the second embodiment becomes effective.

4. Third Embodiment

Figure 9:
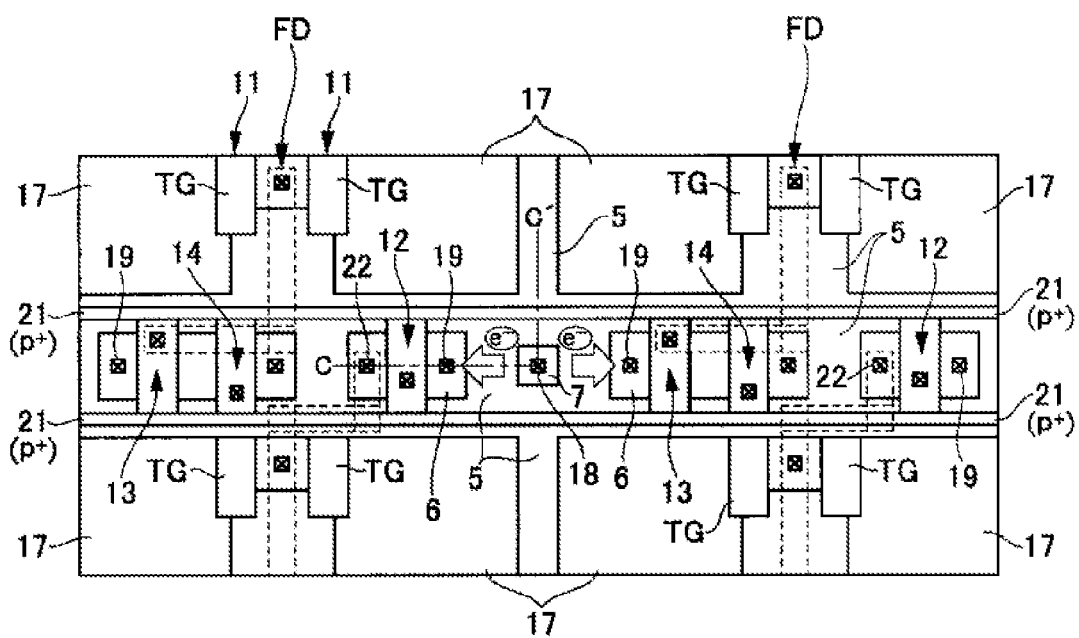
FIG. 9 is a top plan view showing a schematic structure of a main portion of a solid-state image pickup element according to a third embodiment of the present invention.
Figure 10:
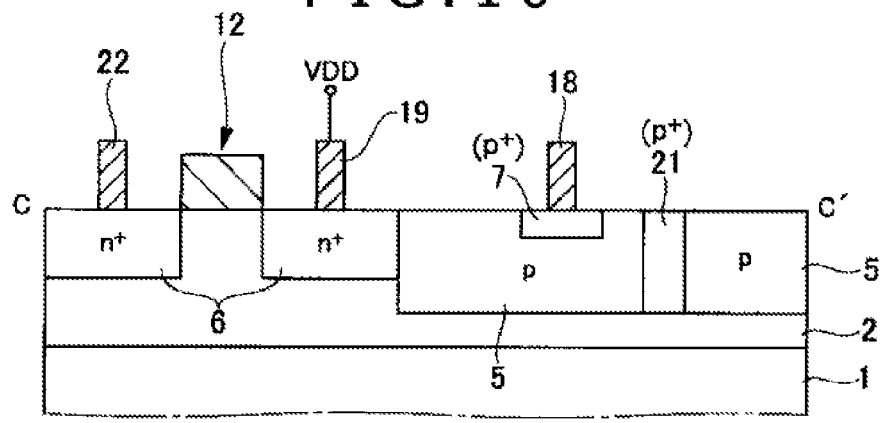
FIG. 10 is a cross sectional view taken on line C-C' of FIG. 9.

FIG. 9 is a top plan view showing a schematic structure of a main portion of a solid-state image pickup element according to a third embodiment of the present invention. Also, FIG. 10 is a cross sectional view taken on line C-C' of FIG. 9.

In the third embodiment, the disposition of the transistors within the pixel area is changed, whereby the n+-type regions 6 which are connected to power sources VDD, respectively, are disposed close to the well contact 18 so as to face both sides of the well contact 18, respectively.

That is to say, in the first embodiment, the three transistors 12, 13 and 14 are disposed as the continuous one set. On the other hand, in the third embodiment, as shown in FIG. 9, the reset transistor 12 is disposed independently of other two transistors, that is, the amplification transistor 13 and the selection transistor 14. In addition, of the two n+-type regions 6 of the reset transistor 12 and the amplification 13, the p+-type regions 6 connected to the power sources VDD, respectively, are disposed on the side of the well contact 18.

In addition, in the third embodiment, with regard to each of the pixels, the reset transistor 12 on the upper side of the photoelectric conversion region 17 of the pixel in each of the rows is connected to the amplification transistor 13 and the selection transistor 14 on the lower side of the photoelectric conversion region 17 of the pixel in each of the rows. For this reason, positions each indicated by a broken line are different from those in the first embodiment shown in FIG. 1.

Also, the p+-type region 21 serving as the barrier is formed only between the well contact 18 and the photoelectric conversion region 17 so as to have the stripe-like planar pattern in the transverse direction similarly to the case of the second embodiment shown in FIG. 7.

Since other structures in the third embodiment are the same as those in the second embodiment shown in FIGS. 7 and 8, the constituent elements corresponding to those in the second embodiment are designated by the same reference numerals or symbols, respectively, and a repeated description is omitted here.

Since in the third embodiment, the structure described above is adopted, the electrons injected from the well contact 18 are discharged to the n+-type regions 6 connected the respective power source lines VDD and disposed on the right and left sides of the well contact 18.

Therefore, since the electrons injected from the well contact 18 do not flow into the floating diffusion region FD, the dark current can be further reduced as compared with the case of the second embodiment.

5. Fourth Embodiment

Figure 11:
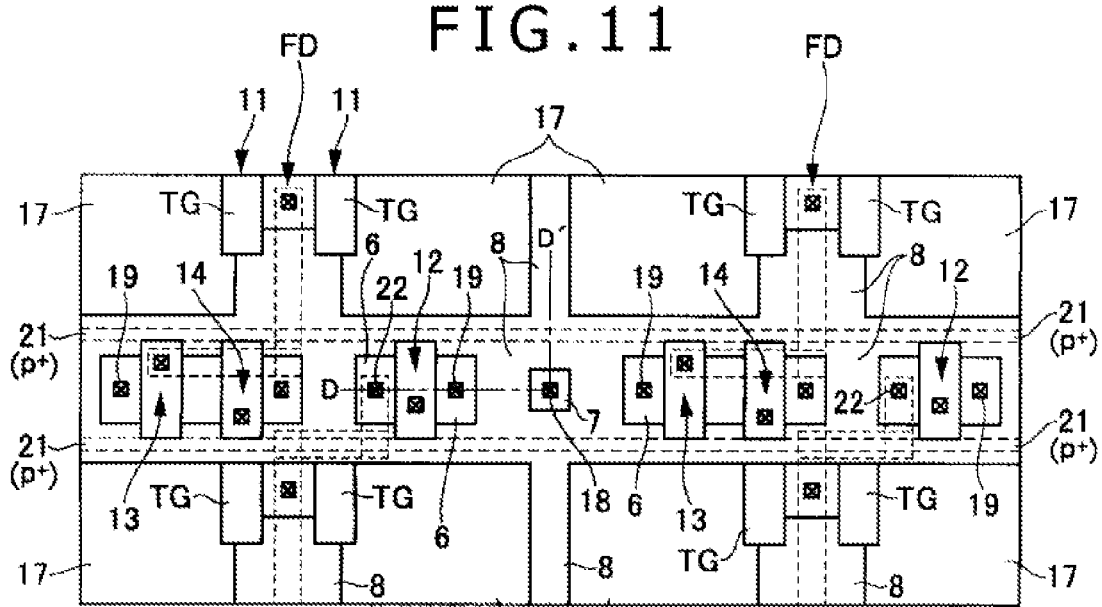
FIG. 11 is a top plan view showing a schematic structure of a main portion of a solid-state image pickup element according to a fourth embodiment of the present invention.
Figure 12:
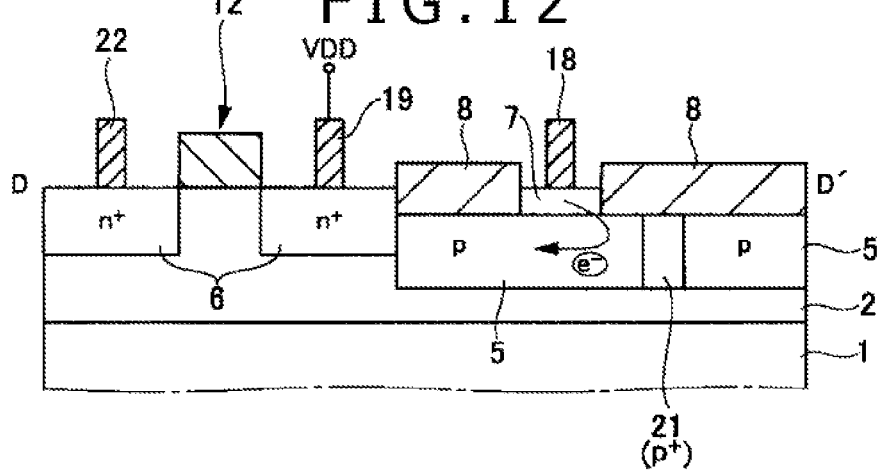
FIG. 12 is a cross sectional view taken on line D-D' of FIG. 11.

FIG. 11 is a top plan view showing a schematic structure of a main portion of a solid-state image pickup element according to a fourth embodiment of the present invention. Also, FIG. 12 is a cross sectional view taken on line D-D' of FIG. 11.

In the fourth embodiment, an insulator 8 and the p-type isolation region 5 under the insulator 8 are used as the isolation region for carrying out the isolation between the photoelectric conversion regions 17 and the like of the pixels. The insulator 8 is formed so as to cover the p-type isolation region 5.

In the fourth embodiment as well, the p+-type region 21 serving as the barrier is formed only between the well contact 18 and the photoelectric conversion region 17 so as to have the stripe-like planar pattern in the transverse direction similarly to the case of the third embodiment.

Since other structures in the fourth embodiment are the same as those in the third embodiment shown in FIGS. 9 and 10, the constituent elements corresponding to those in the third embodiment are designated by the same reference numerals or symbols, respectively, and a repeated description is omitted here.

The p+-type region 21 serving as the barrier may be formed by carrying out the impurity implantation before the insulator 8 is formed, or may be formed by carrying out the impurity implantation through the insulator 8 after the insulator 8 is formed.

In the fourth embodiment, the reset transistor 12 is formed independently of the amplification transistor 13 and the selection transistor 14, and the n+-type regions 6 connected to the respective power source lines are disposed on the right and left sides of the well contact 18, respectively.

On the other hand, similarly to the case of the first embodiment, the structure may also be adopted such that the three transistors 12, 13 and 14 are formed as one set.

In the fourth embodiment, the p+-type region 21 serving as the barrier is formed in the transverse stripe-like shape.

On the other hand, similarly to the case of the first embodiment, the structure may also be adopted such that the p+-type region 21 serving as the barrier is formed only on one side of the right and left sides of the well contact 18, and the electrons are discharged to only the n+-type region 6 on the other hand connected to the power source.

In addition, in the fourth embodiment, the disposition of the transistors is made identical to that in the third embodiment.

On the other hand, there may also be adopted any other suitable transistor disposition such as the transistor dispositions of the first and second embodiments.

6. Fifth Embodiment

Figure 13:
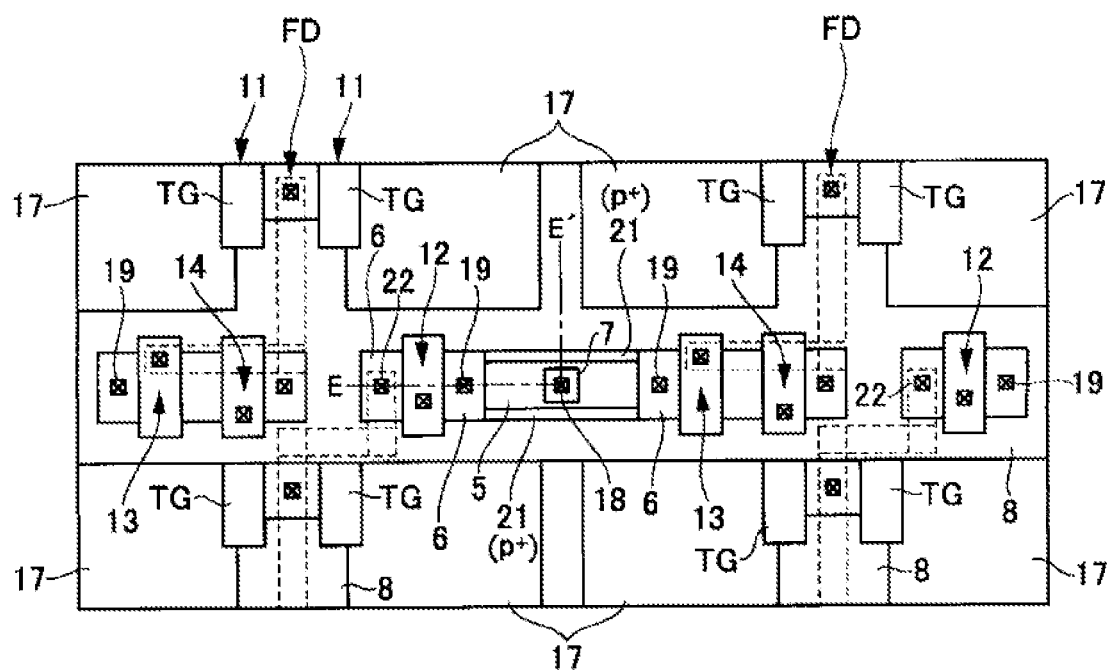
FIG. 13 is a top plan view showing a schematic structure of a main portion of a solid-state image pickup element according to a fifth embodiment of the present invention.

FIG. 13 is a top plan view showing a schematic structure of a main portion of a solid-state image pickup element according to a fifth embodiment of the present invention. Also, FIG. 14 is a cross sectional view taken on line E-E' of FIG. 13.

Figure 14:
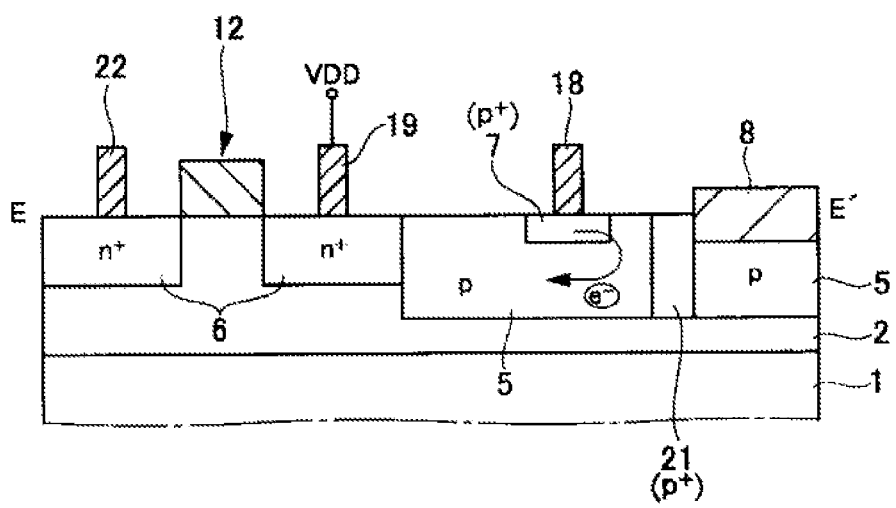
FIG. 14 is a cross sectional view taken on line E-E' of FIG. 13.

In the fifth embodiment, as shown in FIGS. 13 and 14, the isolation region composed of the insulator 8 is not formed between the well constant 18, and the n+-type regions 6 provided on the right and the left sides of the well contact 18, respectively.

Also, a p+-type region 21 serving as the barrier is formed in a transverse stripe-like shape in the portion in which no insulator 8 is formed so as to surround the well contact 18.

Since the flowing of the electrons injected from the well contact 18 into the photoelectric conversion region 17 is suppressed by the p+-type region 21 serving as the barrier, the electrons injected from the well contact 18 are discharged to the n+-type regions 6 on the right and left sides of the well contact 18.

It is noted that although in FIGS. 13 and 14, the p+-type region 21 is formed so as to contact the insulator 8, even when the p+-type region 21 does not contact the insulator 8, it is only necessary to form the p+-type region 21 between the well contact 18 and the insulator 8.

In the fifth embodiment, the structure described above is adopted, whereby after the insulator 8 is formed, the p+-type region 21 can be formed similarly to the case of the first embodiment.

In addition, since the p+-type region 21 can be disposed away from the photoelectric conversion region 17, the dark current can be further reduced.

Since other structures (the structures other than the insulator 8 and the p+-type region 21) in the fifth embodiment are the same as those in the fourth embodiment shown in FIGS. 11 and 12, the constituent elements corresponding to those in the fourth embodiment are designated by the same reference numerals or symbols, respectively, and a repeated description thereof is omitted here.

It is noted that in each of the fourth and fifth embodiments described above, the p-type isolation region 5 is formed under the insulator 8 so as to contact the insulator 8.

On the other hand, for example, a p+-type region may be further formed in a portion (surface portion), contacting the insulators 8, of the p-type isolation region 5, thereby suppressing the influence (the dark current and the like) of the interface level in the vicinity of the interface with the insulator 8 of the semiconductor.

7. Sixth Embodiment

Figure 15:
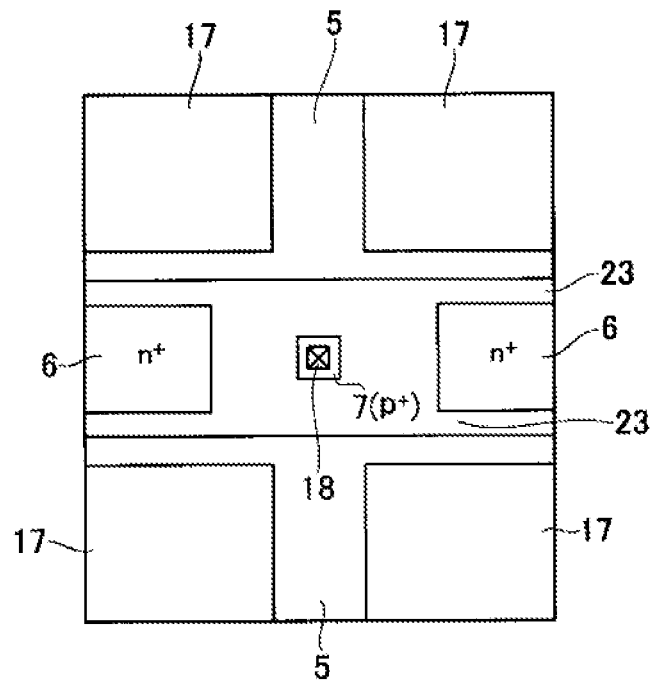
FIG. 15 is a top plan view showing a schematic structure of a main portion of a solid-state image pickup element according to a sixth embodiment of the present invention.
Figure 16:
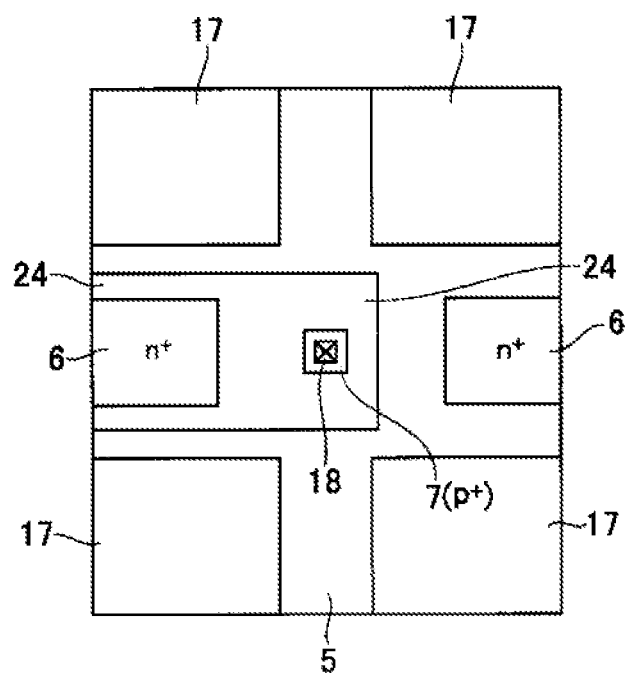
FIG. 16 is a top plan view showing a schematic structure in which a part of the structure shown in FIG. 15 is changed.

FIG. 15 is a top plan view showing a schematic structure of a main portion of a solid-state image pickup element according to a sixth embodiment of the present invention. Also, FIG. 16 is a top plan view showing a schematic structure in which a part of the structure shown in FIG. 15 is changed.

In each of the first to fifth embodiments, the barrier against the electron is formed by the p+-type region 21.

On the other hand, in the sixth embodiment, an n-type impurity is implanted into the isolation region 5 located in the inner side with respect to the boundary between the p-type isolation region 5 and the photoelectric conversion region 17 to make the relative potential lower than that of the isolation region 5, thereby forming the barrier against the electrons.

For example, when the impurity concentration of the isolation region 5 is set as about $5\times10^{18}$ cm$^{-3}$, an n-type impurity having the impurity concentration of about $4\times10^{18}$ cm$^{-3}$. As a result, a concentration difference of about five times is created between the circumference of the well contact 18, and the p-type isolation region 5 in the circumference of the photoelectric conversion region 17, thereby making it possible to form the barrier.

When the n-type impurity implantation is used as the impurity implantation as well, for the threshold value adjustment, which is carried out for the channel portion of the transistor, the n-type impurity implantation can be realized without increasing the number of processes.

In the structure shown in FIG. 15, the n-type impurity is implanted into a transversely extending stripe-like region 23 which surrounds the p+-type region 7 under the well contact 18, and the n+-type regions 6 of the reset transistor 12, the amplification transistor 13 and the selection transistor 14.

As a result, since the potential can be made lower than that of the isolation region 5 in the circumference of the stripe-like region 23. Therefore, the electrons injected from the well contact 18 can be discharged to the right and left side n+-type regions 6.

In the structure shown in FIG. 16, an n-type impurity is implanted into a region 24 which surrounds the p+-type region 7 under the well contact 18, and the n+-type region 6 of the transistor (the selection transistor 14 in the same layout as that of FIG. 1) on the left side of the p+-type region 7. Also, no n-type impurity is implanted into the circumference of the n+-type region 6 of the transistor (the reset transistor 12 in the same layout as that of FIG. 1) on the right side of the p+-type region 7.

As a result, the potential can be made lower than that of the isolation region 5 in the circumference of the region 24. Therefore, the electrons injected from the well contact 18 can be discharged to only the left side n+-type region 6.

It is noted that to what extent the n-type impurity is implanted on the left side of the well contact 18 is not shown in FIG. 16. For example, in the case of the same layout as that of FIG. 1, it is only necessary to implant the n-type impurity into the edge on the well contact 18 side of the gate electrode of the selection transistor 14 or into a portion close to a portion under the gate electrode of the selection transistor 14.

It is noted that with regard to the structure of the barrier for the electron as the minority carrier injected from the well contact, a structure other than the structures (the p$^+$-type region 21, and the regions 23 and 24 each having the lowered potential) in each of the first to sixth embodiments is also expected.

For example, it is also possible to form a barrier composed of an insulator between the well contact in the p-type isolation region, and the photoelectric conversion region, or to form a barrier composed of a region whose band gap is largely different from that of each of other portions because elements contained therein are different from those contained in each of other portions.

In each of the first to sixth embodiments described above, the three transistors, that is, the reset transistor 12, the amplification transistor 13 and the selection transistor 14 which are formed commonly to the two pixels are formed between the photoelectric conversion regions 17 in the pixel rows. However, the positions of the transistors which are formed commonly to plural pixels are by no means limited such a position between the rows. That is to say, any other suitable disposition can also be adopted such that the transistors, for example, are disposed between the columns, or between the rows and between the columns.

In each of the first to sixth embodiments described above, the three transistors 12, 13 and 14 are shared among plural pixels.

The present invention can also be simply applied to a structure that those transistors are provided every one pixel.

However, since in this structure, the distance between the well contact and the photoelectric conversion region is relatively short, preferably, the planar layout of the pixel is devised so that the p$^+$-type region serving as the barrier can be formed.

Figure 22:
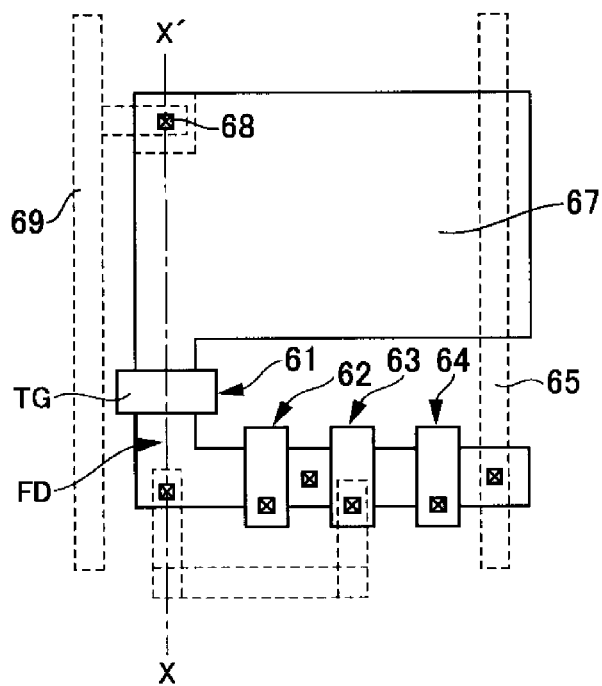
FIG. 22 is a top plan view showing an example of a planar layout of the unit pixel of the CMOS type solid-state image pickup element shown in FIG. 20.
Figure 25:
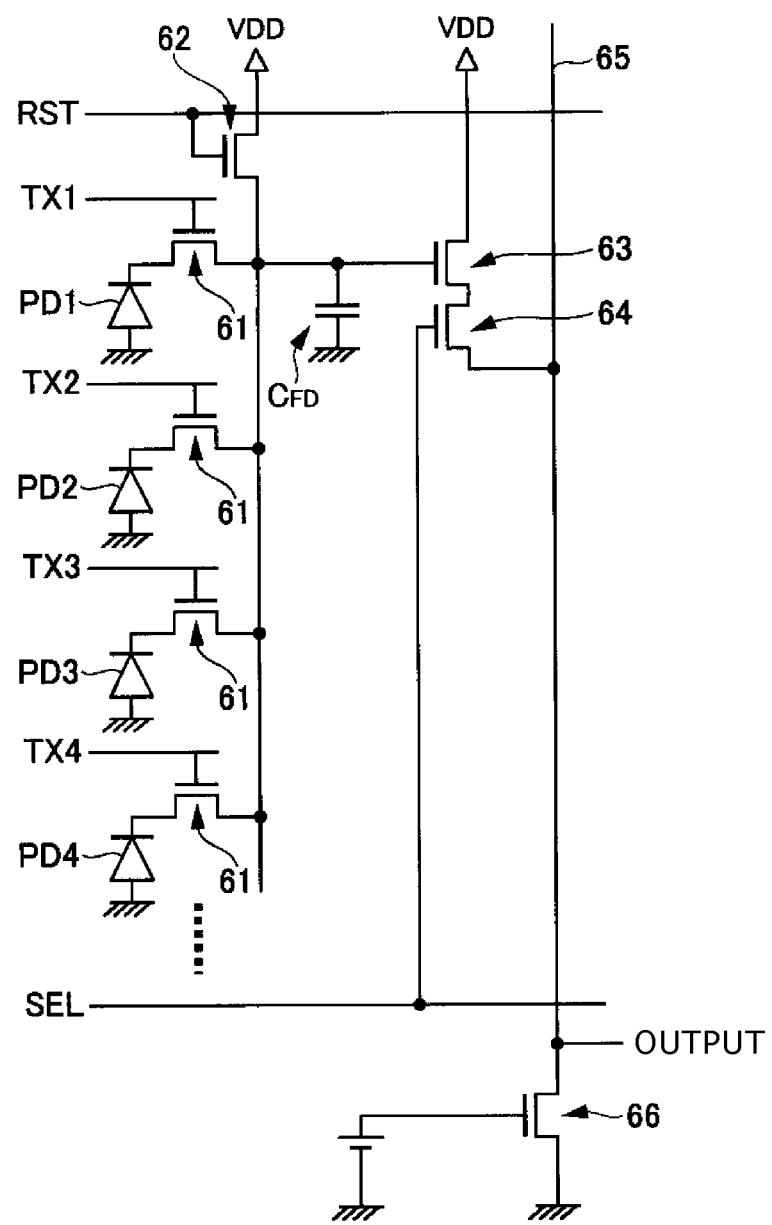
FIG. 25 is a circuit diagram showing a circuit configuration of a CMOS type solid-state image pickup element having a sharing pixel configuration.
Figure 26:
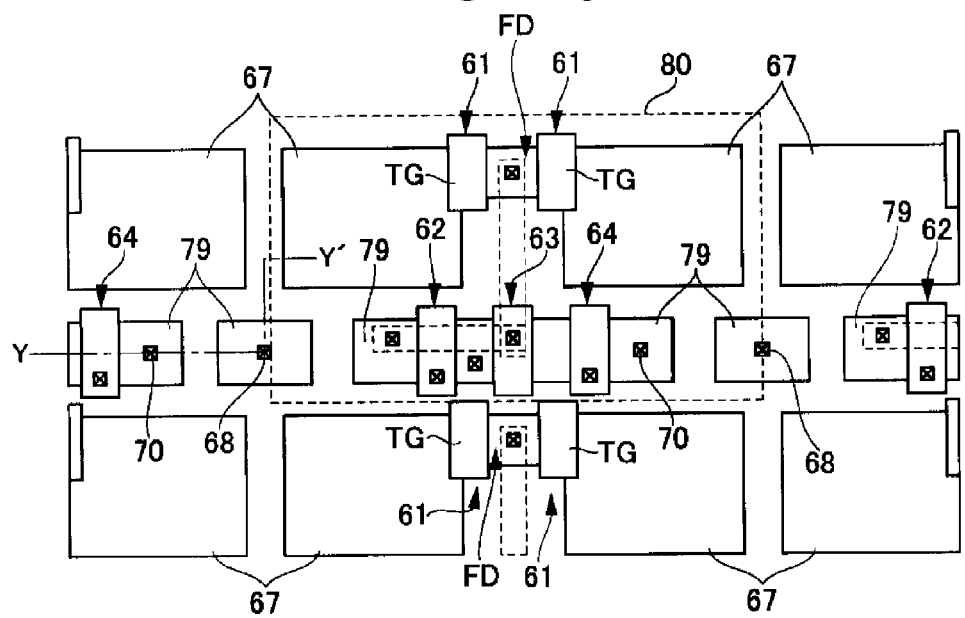
FIG. 26 is a top plan view showing an example of a planar layout in the case where a configuration is adopted such that an amplification transistor and the like are shared between two pixels.
Figure 27:
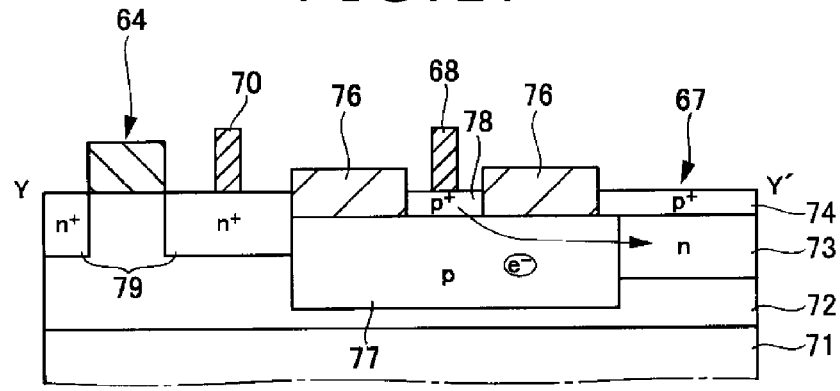
FIG. 27 is a cross sectional view taken on line Y-Y' of FIG. 26 in the case where a pixel isolation region is composed of both an insulator and a p-type region.
Figure 28:
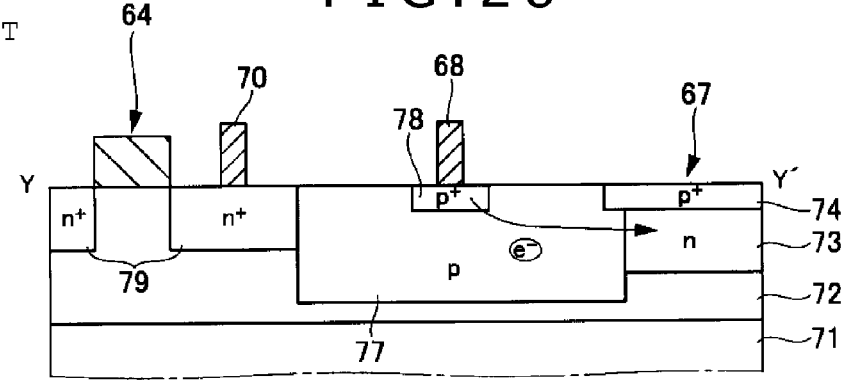
FIG. 28 is a cross sectional view taken on line Y-Y' of FIG. 26 in the case where a pixel isolation region is composed of only the p-type region.

For example, since in the structure shown in FIG. 22, the well contact 68 is considerably close to the photoelectric conversion region 67, it is difficult to form the p$^+$-type region between the well contact 68 and the photoelectric conversion region 67. Then, all it takes is that a structure that the p$^+$-type region under the well contact, and the photoelectric conversion region are isolated from each other by the isolation region composed of the insulator (refer to FIG. 14 shown in Japanese Patent No. 4,075,773) is adopted and the p$^+$-type region serving as the barrier is further formed under the isolation region composed of the insulator similarly to the case of the fourth embodiment. In addition, a structure may also be adopted such that the interval between the well contact and the photoelectric conversion region is made wider than that in the structure shown in FIG. 2, thereby allowing the p$^+$-type region to be formed between the well contact and the photoelectric conversion region.

When the well contact is formed in the corner of the photoelectric conversion region as with the structure shown in FIG. 22, for example, the p$^+$-type region serving as the barrier is formed so as to have an L letter-like planar pattern between the well contact and the photoelectric conversion region.

In each of the first to sixth embodiments described above, the four transistors, that is, the transfer transistor 11, the reset transistor 12, the amplification transistor 13, and the selection transistor 14 are provided in each of the pixels.

The present invention is by no means limited to the structure that those four transistors are provided in each of the pixels, and thus contains a structure as well that two transistors or three transistors are provided in each of the pixels. It is only necessary to provide at least the transfer transistor and the amplification transistor in each of the pixels. Also, the transfer transistor may be provided in each of the pixels, and the transistors other than the transfer transistor, that is, the reset transistor, the amplification transistor, and the selection transistor may be provided commonly to plural pixels.

In each of the first to sixth embodiments described above, in the present invention, the first conductivity type is set as the p-type, and the second conductivity type is set as the n-type.

The present invention contains a structure as well that the conductivity type is reversed, that is, the first conductivity type is set as the n-type and the second conductivity type is set as the p-type. In this structure, the electric charge accumulating region of the photoelectric conversion region is of the p-type, the n-type isolation region is formed in the circumference of the well contact, and the n$^+$-type region is provided between the well contact and the photoelectric conversion region, thereby forming the barrier.

In addition, in the present invention, the semiconductor material composing the solid-state image pickup element composed of the semiconductor substrate, the well region, and the like is by no means limited to silicon which is normally used, and any other suitable semiconductor material can also be used.

8. Seventh Embodiment

Figure 17:
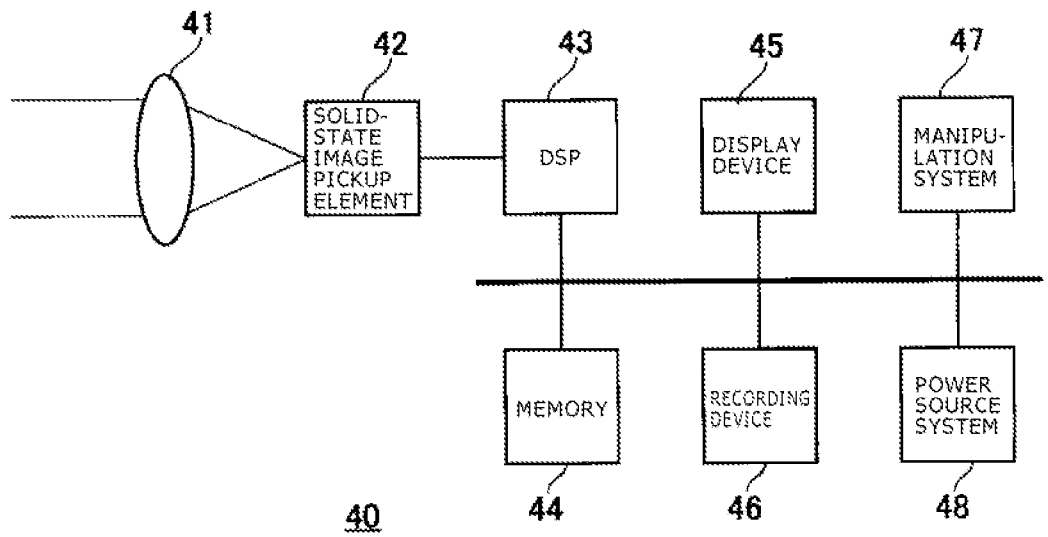
FIG. 17 is a block diagram showing a schematic configuration of an image pickup apparatus according to a seventh embodiment of the present invention.

FIG. 17 is a block diagram showing a schematic configuration of an image pickup apparatus according to a seventh embodiment of the present invention.

As shown in FIG. 17, the image pickup apparatus 40 is composed of an image photographing system having a lens system 41, a solid-state image pickup element (image sensor) 42, a Digital Signal Processor (DSP) 43, a memory 44, a display device 45, a recording device 46, a manipulation system 47, and a power source system 48.

The lens system 41 is a form of a condensing optical system for condensing an incident light.

The DSP 43 is a form of a signal processing portion for processing a signal obtained in the solid-state image pickup element 42 by the photoelectric conversion.

Thus, the solid-state image pickup element according to the above-described embodiments of the present invention is used as the solid-state image pickup element 42.

Since the image pickup apparatus 40 is composed of the solid-state image pickup element according to the first embodiment of the present invention, thereby reducing the dark current, it is possible to realize the high definition image pickup apparatus 40.

It is noted that the image pickup apparatus of the present invention is by no means limited to the configuration shown in FIG. 17, and thus the present invention can be applied to an image pickup apparatus as long as this image pickup apparatus uses the solid-state image pickup element.

For example, the solid-state image pickup element may have a form in which the solid-state image pickup element is formed as one chip, or may have a module-like form which has an image capturing function and into which an image capturing portion and a signal processing portion or an optical system are collectively packaged.

The image pickup apparatus of the present invention can be applied to various kinds of image pickup apparatuses such as a camera or a mobile apparatus having an image capturing function. In addition, a fingerprint detecting apparatus or the like is contained in the present invention in a broad sense of "the image capturing."

The present invention is by no means limited to the embodiments described above, and thus various kinds of constitutions can be adopted without departing from the subject matter of the present invention.

The present application contains subject matter related to that disclosed in Japanese Priority Patent Application JP 2010-075400 filed in the Japan Patent Office on Mar. 29, 2010, the entire content of which is hereby incorporated by reference.

What is claimed is:

1. A solid-state image pickup element, comprising:
a plurality of photoelectric conversion regions;
a respective transfer transistor for each photoelectric conversion region;
a transistor in common for the photoelectric conversion regions;
an isolation region of a first conductivity type isolating said photoelectric conversion regions and said transistors from each other;
a well region of the first conductivity type having said photoelectric conversion regions, said transistor, and said isolation region formed therein;
a contact portion formed on said isolation region via which an electric potential that fixes said well region to a given electric potential can be supplied; and
an impurity region of the first conductivity type in said isolation region and between said contact portion and said photoelectric conversion regions, said impurity region formed so as to extend in a depth direction from a surface of said isolation region and having a higher impurity concentration than that of said isolation region, wherein,
in plan view, said isolation region is formed so as to have a planar pattern including therein a region of a second conductivity type of said transistor, and said contact portion, and
in plan view, said impurity region is between the region of the second conductivity type of said transistor and said contact portion.

2. A solid-state imaging device, comprising:
a substrate;
a well region of a first conductivity type in the substrate;
a plurality of photoelectric conversion regions in the well region;
an isolation region of the first conductivity type in the well region and separating the photoelectric conversion regions from each other;
a floating diffusion, an amplifier transistor, a select transistor and a reset transistor shared by at least two of the photoelectric conversion regions;
a contact portion on the isolation region via which an electric potential can be supplied to the well region to fix the well region to the potential; and
an impurity region of the first conductivity type in the first isolation region of the first conductivity type and between said contact portion and said photoelectric conversion regions, said impurity region formed so as to extend in a depth direction from a surface of said isolation region and having a higher impurity concentration than that of said isolation region, wherein,
the amplifier transistor and the select transistor are disposed in the isolation region,
in plan view, said isolation region is formed so as to have a planar pattern including therein a region of a second conductivity type of said transistor, and said contact portion,
in plan view, said impurity region is between the region of the second conductivity type of said transistor and said contact portion, and
the contact portion, the select transistor and the amplifier transistor are disposed along a same line between two adjacent rows of said photoelectric conversion regions.

3. The solid-state imaging device of claim 2, further comprising a first conductivity type region beneath the isolation region.

4. The solid-state imaging device of claim 2, wherein the amplifier transistor and the reset transistor are connected to a same power source.

5. The solid-state imaging device of claim 2, wherein the impurity region is a P+ barrier region.

6. A electronic device that comprises a solid-state imaging device, the solid-state imaging device comprising:
a substrate;
a well region of a first conductivity type in the substrate;
a plurality of photoelectric conversion regions in the well region;
an isolation region of the first conductivity type in the well region and separating the photoelectric conversion regions from each other;
a floating diffusion, an amplifier transistor, a select transistor and a reset transistor shared by at least two of the photoelectric conversion regions;
a contact portion on the isolation region and configured to supply an electric potential to fix the well region to the potential; and
an impurity region of the first conductivity type in the first isolation region and between said contact portion and said photoelectric conversion regions, said impurity region formed so as to extend in a depth direction from a surface of said isolation region and having a higher impurity concentration than that of said isolation region, wherein,
the amplifier transistor and the select transistor are disposed in the isolation region,
in plan view, said isolation region is formed so as to have a planar pattern including therein a region of a second conductivity type of said transistor, and said contact portion,
in plan view, said impurity region is between the region of the second conductivity type of said transistor and said contact portion, and
the well contact, the select transistor and the amplifier transistor are disposed along a same line between two adjacent rows of said photoelectric conversion regions.

7. The electronic device of claim 6, wherein the solid-state imaging device further comprises a first conductivity type region beneath the isolation region.

8. The electronic device of claim 6, wherein the amplifier transistor and the reset transistor are connected to a same power source.

9. The electronic device of claim 6, wherein the isolation region is a P region and the impurity region is a P+ region.

* * * * *